(12) United States Patent
Kang et al.

(10) Patent No.: US 7,486,543 B2
(45) Date of Patent: Feb. 3, 2009

(54) ASYMMETRICAL SRAM DEVICE AND METHOD OF MANUFACTURING THE SAME

(75) Inventors: Tae-woong Kang, Suwon-si (KR); Jong-hyon Ahn, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 48 days.

(21) Appl. No.: 11/090,160

(22) Filed: Mar. 28, 2005

(65) Prior Publication Data

US 2005/0275117 A1 Dec. 15, 2005

(30) Foreign Application Priority Data

Jun. 12, 2004 (KR) ........................ 10-2004-0043331

(51) Int. Cl.
*G11C 11/00* (2006.01)
*H01L 27/11* (2006.01)

(52) U.S. Cl. ................ 365/156; 365/154; 257/903; 257/E27.098; 257/E27.099; 257/E21.661

(58) Field of Classification Search ................ None
See application file for complete search history.

(56) References Cited

U.S. PATENT DOCUMENTS

| | | | |
|---|---|---|---|
| 6,240,009 B1 | 5/2001 | Naffziger et al. | |
| 6,479,860 B2 | 11/2002 | Ohbayashi | |
| 2001/0023965 A1* | 9/2001 | Ikeda et al. | 257/368 |
| 2003/0006444 A1* | 1/2003 | Amo et al. | 257/296 |
| 2005/0082628 A1* | 4/2005 | Kawasaki et al. | 257/435 |
| 2005/0226031 A1* | 10/2005 | Najm et al. | 365/154 |

FOREIGN PATENT DOCUMENTS

| | | |
|---|---|---|
| JP | 2001-257275 | 9/2001 |
| JP | 2002-176112 | 6/2002 |
| KR | 10-023426 B1 | 8/1999 |
| KR | 10-2003-0003052 A | 1/2003 |
| KR | 10-2004-0004058 A | 1/2004 |

OTHER PUBLICATIONS

Azizi et al. Low-Leakage Asymmetric-Cell SRAM. Aug. 2003. IEEE Transactions on Very Large Scale Integration (VLSI) Systems, vol. 11, No. 4. pp. 701-715.*
Azizi, Navid, et al., "Low-Leakage Asymmetric-Cell SRAM". IEEE Transactions on Very Large Scale Integration (VLSI) Systems, vol. 11(4), pp. 701-715, (Aug. 2003).

* cited by examiner

*Primary Examiner*—Andy Huynh
*Assistant Examiner*—Hoang-Quan T Ho
(74) *Attorney, Agent, or Firm*—Lee & Morse, P.C.

(57) ABSTRACT

In an asymmetrical SRAM device, and a method of manufacturing the same, the asymmetrical SRAM device includes a semiconductor substrate on which a plurality of unit cell regions are defined, and a plurality of active regions formed in each of the unit cell regions of the semiconductor substrate, wherein the active regions of each unit cell region are a mirror image of active regions of an adjacent one of the plurality of unit cell regions with respect to a boundary line between the adjacent unit cell regions.

21 Claims, 9 Drawing Sheets

ASYMMETRICAL SRAM DEVICE AND METHOD OF MANUFACTURING THE SAME

BACKGROUND OF THE INVENTION

1. Field of the Invention

The present invention relates to a static random access memory (SRAM) and a method of manufacturing the same. More particularly, the present invention relates to an asymmetrical SRAM device that can prevent leakage current and a method of manufacturing the same.

2. Description of the Related Art

Semiconductor devices can be classified as dynamic random access memory (DRAM), nonvolatile memory, or SRAM. SRAM offers advantages of high speed operation, low power consumption, and a simple operation method. Additionally, SRAM has an advantage of easy design, since information stored therein does not require refreshing periodically, as does DRAM.

SRAM includes a pair of inverters operating in opposite phase from each other. A conventional SRAM has a symmetrical configuration in which each of a pair of inverters performs the same function.

Figure 1:
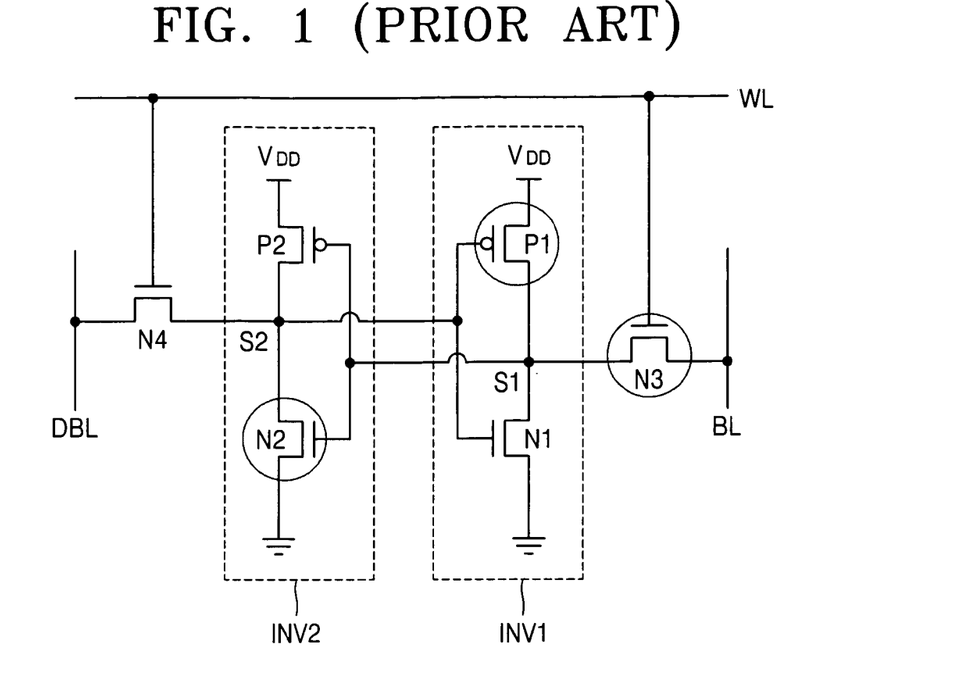
FIG. 1 is a circuit diagram of a unit cell of a conventional SRAM device.

FIG. 1 is a circuit diagram of a unit cell of a conventional SRAM device.

As depicted in FIG. 1, a full complementary metal oxide semiconductor (CMOS) SRAM having a pair of inverters includes first and second inverters INV1 and INV2 that constitute a latch and first and second pass transistors N3 and N4 connected to an output of the first and second inverters INV1 and INV2, respectively.

The first inverter INV1 includes a first positive channel metal oxide semiconductor (PMOS) transistor P1 and a first negative channel metal oxide semiconductor (NMOS) transistor N1. The second inverter INV2 includes a second PMOS transistor P2 and a second NMOS transistor N2. The sources of each of the PMOS transistors P1 and P2 are connected to a power source voltage $V_{DD}$, and the drains are connected to the first and second NMOS transistors N1 and N2, respectively. The sources of each of the first and second NMOS transistors N1 and N2 are connected to a ground $V_{SS}$. An input of the first inverter INV1 is connected to an output S2 of the second inverter INV2, and an input of the second inverter INV2 is connected to an output S1 of the first inverter INV1.

The first pass transistor N3 has a gate connected to a word line WL, a drain connected to a bit line BL, and a source connected to the output S1 of the first inverter INV1. The second pass transistor N4 has a gate connected to the word line WL, a drain connected to a bit line bar DBL, and a source connected to the output S2 of the second inverter INV2. Here, the bit line bar DBL is applied to an inverted bit line signal.

The full CMOS SRAM device is operated in the following manner. When a potential of the word line WL is "1," i.e., high, the first and second pass transistors N3 and N4 are turned "on," and signals of the bit lines BL and DBL are transmitted to the first and second inverters INV1 and INV2, respectively. Writing or reading of data can then be performed.

However, more "0" data than "1" data is stored in the SRAM cells that are output by the first inverter INV1. Therefore, a leakage current occurs in a particular transistor that constitutes the SRAM cell because the data stored in the SRAM device is biased to "0".

More specifically, when reading data, the bit line BL and the bit line bar DBL are precharged to "1," and "0" is applied to the word line WL. When the output of the first inverter INV1 is "0" and the output of the second inverter INV2 is "1", leakage current is generated at the transistors, in which a potential difference is generated between the source and the drain, i.e., the first PMOS transistor P1, the second NMOS transistor N2, and the first pass transistor N3.

Figure 2:
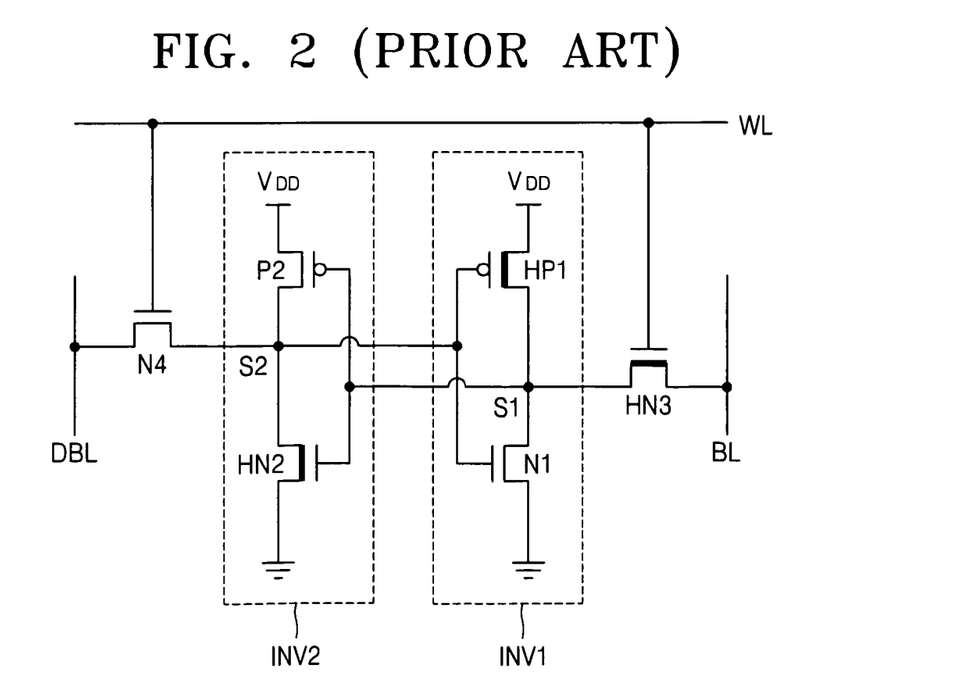
FIG. 2 is a circuit diagram of a unit cell of a conventional asymmetrical SRAM device.

A conventional method of solving this problem sought to improve the threshold voltage of the transistors that cause the leakage current. FIG. 2 is a circuit diagram of a unit cell of a conventional asymmetrical SRAM device in this conventional method. As illustrated in FIG. 2, when the output S1 of the first inverter INV1 is "0", the transistors that generate leakage current, such as the first PMOS transistor (P1 of FIG. 1), the second NMOS transistor (N2 of FIG. 1), and the first pass transistor (N3 of FIG. 1), are replaced by high voltage transistors HP1, HN2, and HN3, respectively. Accordingly, the leakage current of the first PMOS transistor, the second NMOS transistor, and the first pass transistor may be reduced.

Figure 3:
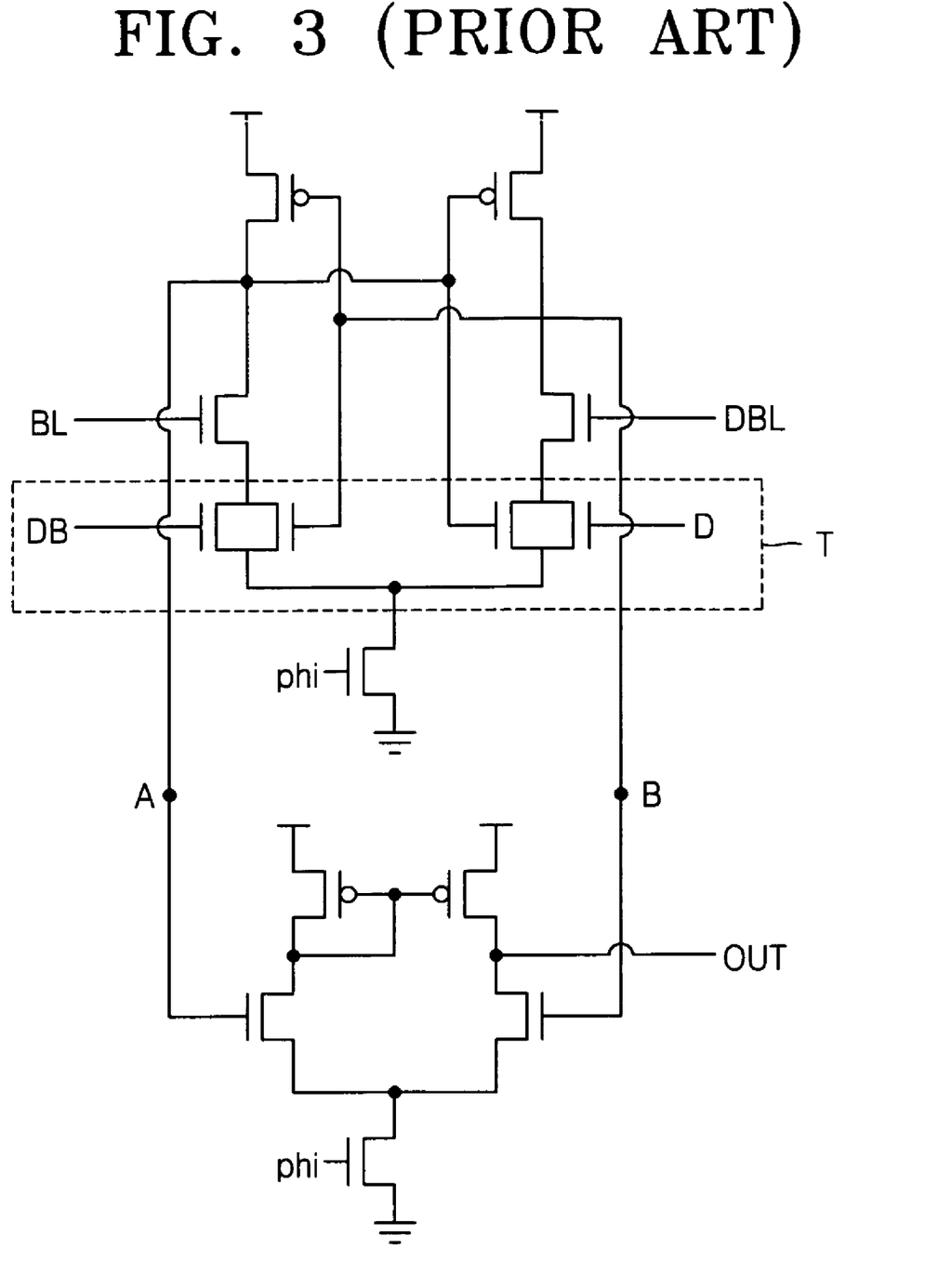
FIG. 3 is a circuit diagram of a sense amplifier applied to the conventional asymmetrical SRAM device in FIG. 2.

FIG. 3 is a circuit diagram of a sense amplifier applied to the conventional asymmetrical SRAM device in FIG. 2.

The asymmetrical SRAM device has a stable static noise margin (SNM) when the stored data is "0." When the stored data is "1", however, there is a high possibility of generating an error. A sense amplifier, as illustrated in FIG. 3, has been proposed in connection with this conventional method to compensate for the error. The proposed sense amplifier has a structure in which a complementary transistor block T is connected to a conventional sense amplifier. Data "1" is continuously stored in D of the complementary transistor block T and data "0" is continuously stored in DB. Errors in the SRAM device when data is "1" can be prevented by employing the modified sense amplifier.

Figure 4:
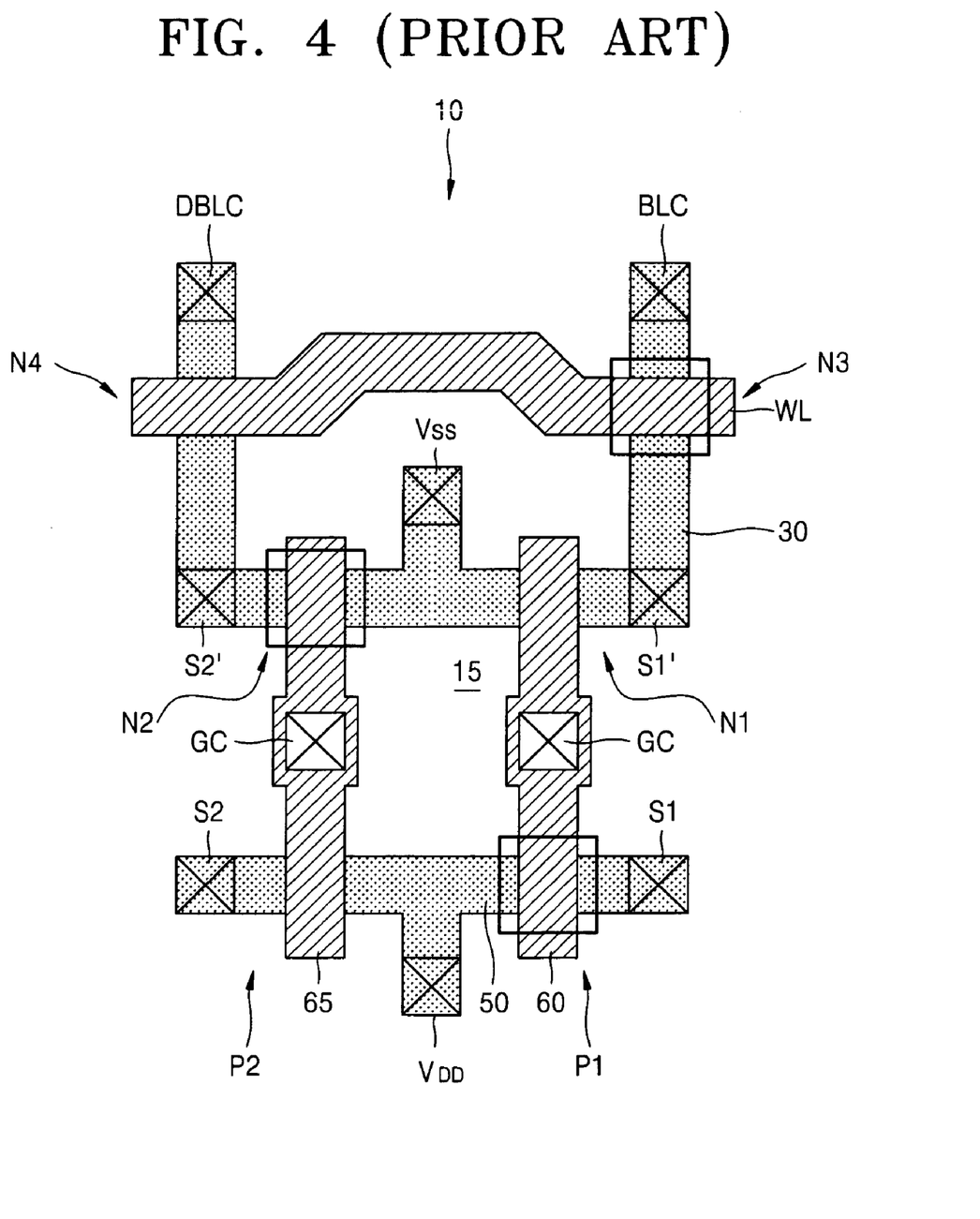
FIG. 4 illustrates a layout of a unit cell of the conventional asymmetrical SRAM device in FIG. 2.

FIG. 4 illustrates a plan view, i.e., a layout, of a unit cell of the conventional asymmetrical SRAM device shown in FIG. 2. Referring to FIG. 4, an isolation film 15 is formed in a semiconductor substrate 10. The isolation film 15 defines a first active region 30, on which NMOS transistors N1 through N4 will be formed, and a second active region 50, on which PMOS transistors P1 and P2 will be formed, on the silicon semiconductor substrate 10. The first active region 30 is a region for forming a P well in a "U" shape. Here, portions of both sidewalls of the "U" shape will be called vertical portions and a portion that connects both vertical portions will be called a horizontal portion. The second active region 50 is a region for forming an N well in a "-" shape, i.e., a bar shape.

A word line WL extends at right angles to the vertical portions of the first active region 30, and first and second gate lines 60 and 65 are formed to contact a horizontal portion of the first active region 30 and a predetermined portion of the second active region 50. The word line WL becomes the gate electrode of the first and second pass transistors N3 and N4. The first gate line 60 becomes the gate electrode of the first PMOS transistor P1 and the first NMOS transistor N1. The second gate line 65 becomes the gate electrode of the second PMOS transistor P2 and the second NMOS transistor N2.

The first and second pass transistors N3 and N4 and the first and second NMOS transistors N1 and N2 are defined by implanting an N-type dopant in the first active region 30 on both sides of the word line WL and of the gate lines 60 and 65. The first and second PMOS transistors P1 and P2 are formed by implanting a P-type dopant in the second active region 50 on both sides of the first and second gate lines 60 and 65.

In FIG. 4, BLC indicates a region for forming a contact to connect the drain of the first pass transistor N3 and the bit line BL, and DBLC indicates a region for forming a contact to connect the drain of the second pass transistor N4 and the bit line bar DBL. S1 and S1', and S2 and S2' indicate the outputs of the inverters INV1 and INV2, respectively. In the drawing, S1 and S1', and S2 and S2' are illustrated separately, but they will be connected when forming wiring in a subsequent process. $V_{DD}$ is a region to be connected to a power source line, and $V_{SS}$ is a region to be connected to a ground line. GC is a region to be connected to the gate electrode and a gate power source line (not shown).

To manufacture an asymmetrical SRAM device, the threshold voltages of the first PMOS transistor P1, the second NMOS transistor N2, and the first pass transistor N3 must be increased. To increase the threshold voltages, threshold voltage control ions for high voltage transistors must be implanted into regions of the first PMOS transistor P1, the second NMOS transistor N2, and the first pass transistor N3. When implanting the threshold voltage control ions, an additional photomask is required, exposing only the regions of the first PMOS transistor P1, the second NMOS transistor N2, and the first pass transistor N3.

However, as the integration density of semiconductor devices increases, gaps between the each of the transistor regions of the SRAM device decrease, and a gap of a mask pattern that can be formed by photolithography reaches a limit thereof.

Therefore, it is difficult to selectively expose the first PMOS transistor P1, the second NMOS transistor N2, and the first pass transistor N3 in the narrow unit SRAM cell region.

As illustrated in FIG. 4, the first PMOS transistor P1 and the second PMOS transistor P2 are very close to each other, the second NMOS transistor N2 is very close to the first NMOS transistor N1 and the second pass transistor N2, and the third pass transistor N3 is also close to the first NMOS transistor N1.

Therefore, problems may occur when changing the threshold voltage of the MOS transistors that constitute the SRAM cell, since other adjacent transistors may be exposed when opening the regions of the first PMOS transistor P1, the second NMOS transistor N2, and the first pass transistor N3.

SUMMARY OF THE INVENTION

The present invention is therefore directed to an asymmetrical SRAM and a method of manufacturing the same, which substantially overcome one or more of the problems due to the limitations and disadvantages of the related art.

It is a feature of an embodiment of the present invention to provide an asymmetrical SRAM device that does not require a changed threshold voltage of a MOS transistor that constitutes a SRAM cell.

It is another feature of an embodiment of the present invention to provide an asymmetrical SRAM device that can improve a photolithography margin in a limited unit SRAM cell region.

It is still another feature of an embodiment of the present invention to provide an asymmetrical SRAM device that can prevent leakage current.

It is yet another feature of an embodiment of the present invention to provide a method of manufacturing the asymmetrical SRAM device.

At least one of the above and other features and advantages of the present invention may be realized by providing an asymmetrical SRAM device including a semiconductor substrate on which a plurality of unit cell regions are defined, and a plurality of active regions formed in each of the unit cell regions of the semiconductor substrate, wherein the active regions of each unit cell region are a mirror image of active regions of an adjacent one of the plurality of unit cell regions with respect to a boundary line between the adjacent unit cell regions.

The plurality of active regions may include a first NMOS active region extending in a bar shape, a second NMOS active region parallel to the first NMOS active region and separated a predetermined distance from the first NMOS active region, a first PMOS active region having a bar shape and located between the first NMOS active region and the second NMOS active region, and a second PMOS active region having a bar shape and located between the first PMOS active region and the second NMOS active region.

The second PMOS active region may be shifted by a predetermined distance from the first PMOS active region in a lengthwise direction of the active regions.

The asymmetrical SRAM device may further include a first gate electrode extended to contact a predetermined portion of the first NMOS active region and a predetermined portion of the first PMOS active region, a second gate electrode extended to contact a predetermined portion of the second NMOS active region and a predetermined portion of the second PMOS active region, a first word line parallel to the first gate electrode and contacting a predetermined portion of the first NMOS active region, and a second word line parallel to the second gate electrode and contacting a predetermined portion of the second NMOS active region.

The asymmetrical SRAM device may further include first threshold voltage control ions implanted into the active region, and second threshold voltage control ions for a high voltage transistor implanted into an overlap region of the first gate electrode and the first PMOS active region, an overlap region of the second gate electrode and the second NMOS active region, and an overlap region of the first word line and the first NMOS active region.

The asymmetrical SRAM device may further include source/drain regions of the MOS transistors respectively formed on the active region on both sides of the first and second gate electrodes and the first and second word lines, a first NMOS transistor and a first pass transistor defined within the first NMOS active region, a second NMOS transistor and a second pass transistor defined within the second NMOS active region, a first PMOS transistor defined within the first PMOS active region, and a second PMOS transistor defined within the second PMOS active region.

The asymmetrical SRAM device may further include a first metal wiring that electrically connects the first gate electrode and the drain of the second NMOS transistor, and a second metal wiring that electrically connects the second gate electrode and the drain of the first NMOS transistor.

At least one of the above and other features and advantages of the present invention may be realized by providing an asymmetrical SRAM device including a semiconductor substrate on which a plurality of unit cell regions are defined in a matrix, a plurality of active regions located in each of the unit cell regions and including a first NMOS active region on which a first NMOS transistor and a first pass transistor will be formed, a second NMOS active region on which a second NMOS transistor and a second pass transistor will be formed, a first PMOS active region on which a first PMOS transistor will be formed, and a second PMOS active region on which a second PMOS transistor will be formed, a gate structure including a first gate electrode contacting the first NMOS active region and the first PMOS active region, a second gate electrode contacting the second NMOS active region and the second PMOS active region, a first word line contacting the first NMOS active region, and a second word line contacting the second NMOS active region, a plurality of source and drain regions respectively formed on the active region on both sides of the gate structure to define the first and second NMOS transistors, the first and second PMOS transistors, and the first and second pass transistors, and a plurality of high voltage control layers formed in the second NMOS transistor region, the first pass transistor region, and the first PMOS transistor region, wherein each unit cell region is a mirror image of an adjacent one of the unit cell regions with respect to a boundary line between the adjacent unit cell regions, and the plurality of high voltage threshold voltage control layers face another high voltage threshold voltage control layer of the adjacent unit cell region with respect to the boundary line of the unit cell regions.

The first and second NMOS active regions and the first and second PMOS active regions may have a bar shape and extend in a same direction.

The first and second PMOS active regions may be separated by a predetermined distance and extend parallel to each other, and the first and second PMOS active regions may be interposed between the first and second NMOS active regions.

The first and second NMOS active regions may be disposed on a substantially same line.

An end of the second PMOS active region may be shifted from a corresponding end of the first PMOS active region by a predetermined distance, thereby overlapping a predetermined portion of the second PMOS active region and an isolation film.

The first and second gate electrodes may extend parallel to each other, and the first word line may extend parallel to the first gate electrode a predetermined distance apart therefrom, and the second word line may extend parallel to the second gate electrode a predetermined distance apart therefrom.

The first gate electrode may further extend to overlap a predetermined portion of the second PMOS active region, and the first gate electrode may overlap an end of the second PMOS active region.

The second gate electrode may further extend to overlap a predetermined portion of the first PMOS active region, and the second gate electrode may overlap an end of the second PMOS active region.

The asymmetrical SRAM device may further include a first metal wiring that electrically connects the first gate electrode and the drain of the second NMOS transistor and a second metal wiring that electrically connects the second gate electrode and the drain of the first NMOS transistor.

The asymmetrical SRAM device may further include threshold voltage control ions at a different concentration from the high voltage threshold voltage control layer implanted in the active region.

At least one of the above and other features and advantages of the present invention may be realized by providing an asymmetrical SRAM device including a plurality of unit cell regions, and a unit SRAM cell formed on the each unit cell, the unit SRAM cell including a first inverter having a first PMOS high voltage transistor and a first NMOS transistor, a second inverter having a second PMOS transistor and a second NMOS high voltage transistor, a first pass high voltage transistor connected to the second inverter, and a second pass transistor connected to the first inverter, wherein the unit SRAM cell is a mirror image of an adjacent unit SRAM cell with respect to a boundary line between adjacent unit SRAM cells, and the first PMOS high voltage transistor, the second NMOS high voltage transistor, and the first pass high voltage transistor are located adjacent to the boundary line of the unit SRAM cell to face high voltage transistors of adjacent unit SRAM cells.

The unit SRAM cell may include an active region, on which each of the transistors are formed, a gate electrode structure contacting the active region, and a source and drain region, each formed on the active region on either side of the gate electrode structure.

The active region may include a first NMOS active region, on which the first NMOS transistor and the first high voltage pass transistor are formed, a second NMOS active region, on which the second NMOS high voltage transistor and the second pass transistor are formed, a first PMOS active region, on which the first PMOS high voltage transistor is formed, and a second PMOS active region, on which the second PMOS transistor is formed, wherein each of the first and second NMOS active regions and the first and second PMOS active regions are formed in a bar shape extending in a same direction, the first and second PMOS active regions are parallel to each other spaced apart by a predetermined distance, and the first and second NMOS active regions are located between the first and second PMOS active regions.

The asymmetrical SRAM device may further include a first gate electrode extended to contact a predetermined portion of the first NMOS active region and a predetermined portion of the first PMOS active region, a second gate electrode extended to contact a predetermined portion of the second NMOS active region and a predetermined portion of the second PMOS active region, a first word line parallel to the first gate electrode and contacting a predetermined portion of the first NMOS active region, and a second word line parallel to the second gate electrode and contacting a predetermined portion of the second NMOS active region.

The asymmetrical SRAM device may further include a first metal wiring that electrically connects an input of the first inverter and an output of the second inverter and a second metal wiring that electrically connects an output of the first inverter and an input of the second inverter.

At least one of the above and other features and advantages of the present invention may be realized by providing a method of manufacturing an asymmetrical SRAM device including preparing a semiconductor substrate on which a plurality of unit cell regions are defined, defining active regions including first and second NMOS active regions and first and second PMOS active regions by forming an isolation film in each unit cell region, implanting threshold voltage control ions into the entire active regions, implanting threshold voltage control ions for high voltage transistors into a predetermined portion of the first NMOS active region, a predetermined portion of the second NMOS active region, and a predetermined portion of the first PMOS active region, forming gate electrodes to contact the active regions, and forming source and drain regions by implanting a dopant on both sides of the gate electrodes, wherein the active regions of each unit cell region are a mirror image of active regions of an adjacent one of the unit cell regions with respect to a boundary line between the adjacent unit cell regions, and the threshold voltage control ions for the high voltage transistors are simultaneously implanted into regions for implanting the threshold voltage control ions for the high voltage transistors of adjacent unit cell regions when implanting ions into the region of the unit cell region, by locating the regions into which the threshold voltage control ions for the high voltage transistors are implanted adjacent to the boundary line of the unit cell region.

Implanting the threshold voltage control ions may include selectively implanting first threshold voltage control ions into the first and second NMOS active regions and selectively implanting second threshold voltage control ions into the first and second PMOS active regions.

Implanting the threshold voltage control ions for high voltage transistors may include forming a first mask pattern to expose a predetermined portion of the first and second NMOS active regions, implanting threshold voltage control ions for first high voltage transistors into the exposed first and second NMOS active regions, removing the first mask pattern, forming a second mask pattern to expose a predetermined portion of the first and second PMOS active regions, implanting threshold voltage control ions for second high voltage transistors into the exposed first and second PMOS active regions, and removing the second mask pattern.

The first mask pattern may simultaneously expose the first and second NMOS active regions of the four adjacent unit cell regions. The second mask pattern may simultaneously expose the first PMOS active regions of two adjacent unit cell regions.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Application No. 2004-43331, filed on Jun. 12, 2004, in the Korean Intellectual Property Office and entitled: "Asymmetrical SRAM Device and Method of Manufacturing the Same," is incorporated by reference herein in its entirety.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. Like reference numerals and characters in the drawings denote like elements throughout.

FIGS. 5 through 9 illustrate layouts of an asymmetrical SRAM device according to an embodiment of the present invention.

Figure 5:
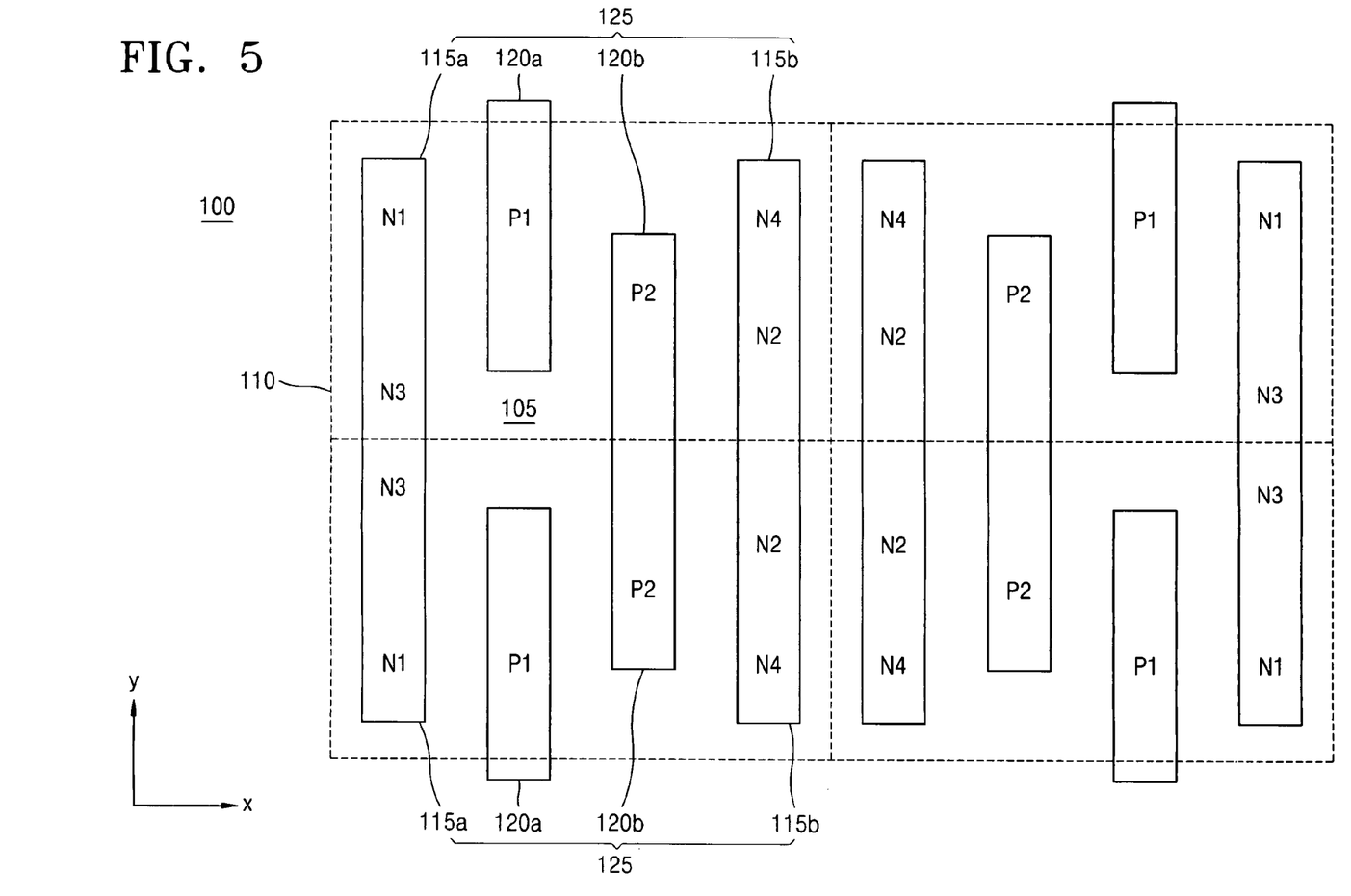
FIGS. 5 through 9 illustrate layouts of an asymmetrical SRAM device according to an embodiment of the present invention.

Referring to FIG. 5, a semiconductor substrate 100 is defined into a plurality of unit cell regions 110. The plurality of unit cell regions may be defined in a matrix. The unit cell regions 110 are regions for forming a pair of inverters INV1 and INV2 and a pair of pass transistors as described with reference to FIG. 1. An active region 125 is formed in each of the unit cell regions 110. As is well known, the active region 125 is defined by isolation films 105. The active region 125 of this embodiment includes first and second NMOS active regions 115a and 115b and first and second PMOS active regions 120a and 120b. The first and second NMOS active regions 115a and 115b and the first and second PMOS active regions 120a and 120b are each separated by a predetermined distance, and have a bar shape extending in the y-direction. The first and second PMOS active regions 120a and 120b are located between the first NMOS active region 115a and the second NMOS active region 115b. Also, the first NMOS active region 115a and the second NMOS active region 115b may preferably be disposed on a substantially same line in a same plane. Although the first PMOS active region 120a and the second PMOS active region 120b are on the same plane, ends of the first and second PMOS active regions 120a and 120b are not aligned. That is, the second PMOS active region 120b is shifted by a predetermined distance in the y-direction from the first PMOS active region 120a, and a line (not shown) connecting the ends of the first and second PMOS active regions 120a and 120b has a zigzag shape.

The first NMOS active region 115a is a region for forming the first NMOS transistor N1 and the first pass transistor N3. The second NMOS active region 115b is a region for forming the second NMOS transistor N2 and the second pass transistor N4. The first PMOS active region 120a is a region for forming the first PMOS transistor P1. The second PMOS active region 120b is a region for forming the second PMOS transistor P2.

The first and second NMOS active regions 115a and 115b may be P wells, and the first and second PMOS active regions 120a and 120b may be N wells.

The active region 125 of the unit cell region 110 is a mirror image of an active region 125 of an adjacent unit cell region 110 with respect to a boundary line between the adjacent unit cell regions 110.

That is, as depicted in FIG. 5, taking four unit cell regions 110, for example, by making each of the unit cell regions 110 a mirror image of its adjacent unit cell regions 110 in both x- and y-directions, the active regions 115a and 115b, on which the first pass transistor N3 and the second NMOS transistor N2, which have a high possibility of leakage current, are formed, respectively, are adjacent to boundary lines of the unit cell region 110.

Threshold voltage control ions are then implanted into each of the active regions 125. More specifically, after forming a first mask pattern (not shown) to expose the first and second NMOS active regions 115a and 115b, threshold voltage control ions for NMOS are implanted into the exposed first and second NMOS active regions 115a and 115b. Afterward, the first mask pattern is removed and a second mask pattern (not shown) to expose the first and second PMOS active regions 120a and 120b is formed. Threshold voltage control ions for PMOS are implanted into the exposed first and second PMOS active regions 120a and 120b. At this time, the ions implanted for controlling the threshold voltage for the NMOS and PMOS may include boron, such as $BF_3^+$, and the concentrations may be varied.

Figure 6:
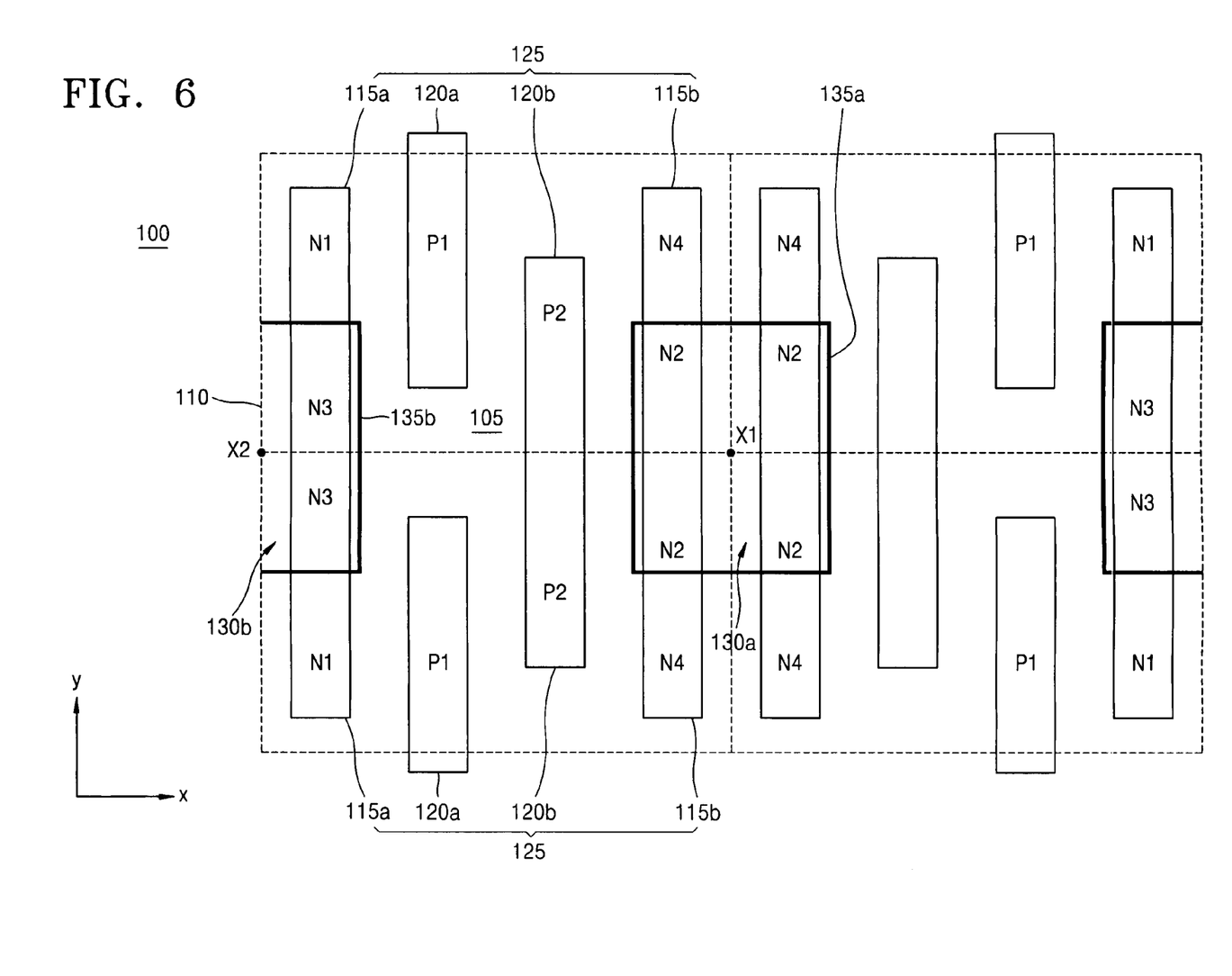

Subsequently, to manufacture an asymmetrical SRAM device according to an embodiment of the present invention, as depicted in FIG. 6, third and fourth mask patterns 135a and 135b are formed to expose a region 130a for forming the second NMOS transistor N2, and a region 130b for forming the first pass transistor N3. In the present embodiment, as described above, the active regions 125 in the unit cell regions 110 are symmetrical with respect to the x- and y-directions. Accordingly, the active regions, on which the second NMOS transistor N2 of each unit cell region 110 will be formed, are concentrated on a contact point X1 of the exemplary four unit cell regions 110, and the active regions, on which the first pass transistors N3 will be formed, are concentrated on a contact point X2 of the exemplary four unit cell regions 110. Therefore, the region for forming the second NMOS transistor N2 of the four adjacent unit cell regions 110, and the region for forming the first pass transistor N3 of the four adjacent unit cell regions 110, are all exposed simultaneously by the third and fourth mask patterns 135a and 135b, respectively. At this time, the third and fourth mask patterns 135a and 135b are separated by a distance sufficient for a photolithography margin. Afterward, threshold voltage control ions for a first high voltage transistor are implanted into the exposed second NMOS transistor region 130a and the first pass transistor region 130b. Then, the second NMOS transistor N2 has a greater threshold voltage than the first NMOS transistor N1, and the first pass transistor N3 has a greater threshold voltage than the second pass transistor N4, according to the implantation of the threshold voltage control ions for the first high voltage transistor.

Figure 7:
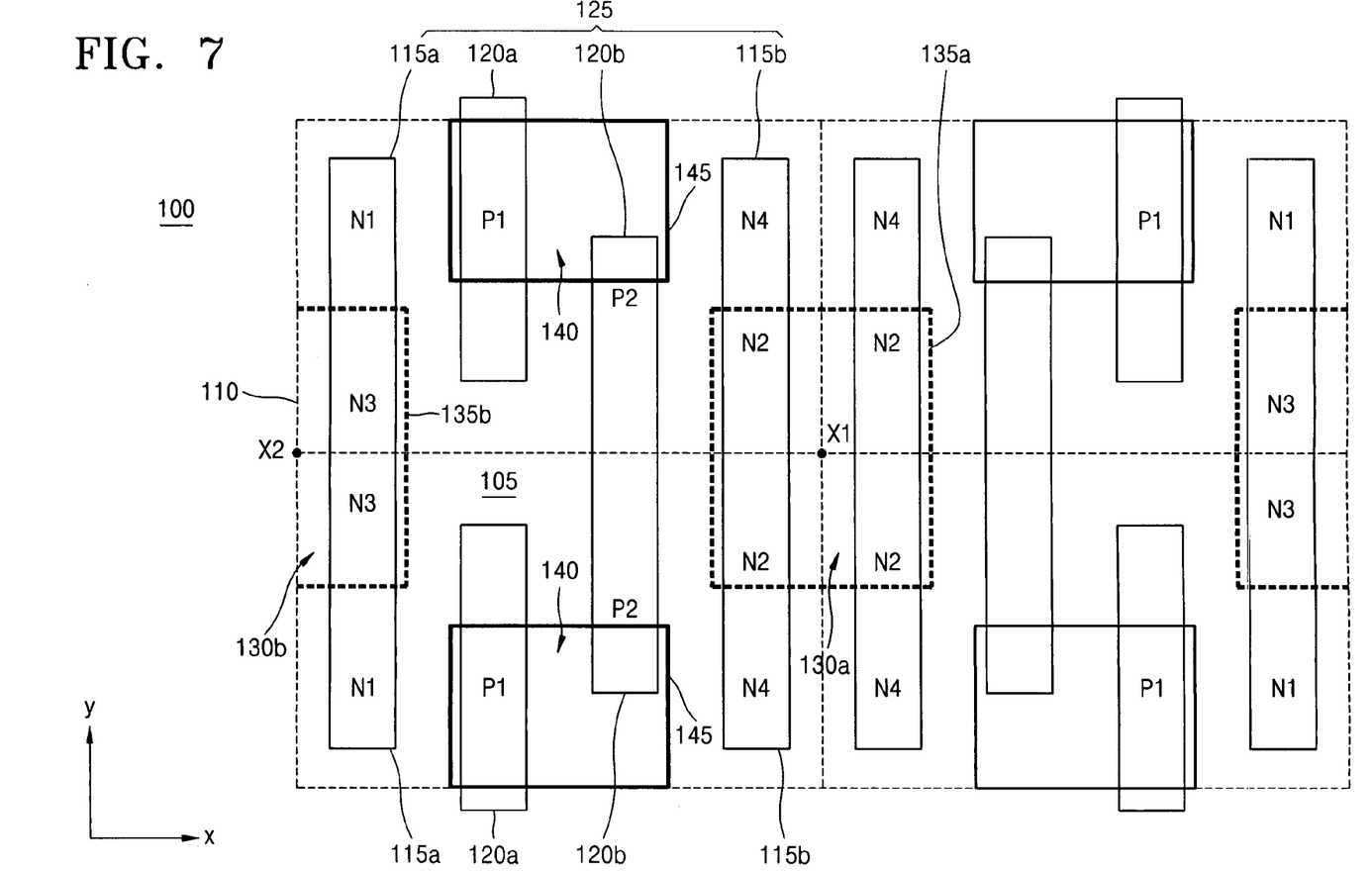

Referring to FIG. 7, the third and fourth mask patterns 135a and 135b are removed by a conventional method. In FIG. 7, the removed state of the third and fourth mask patterns 135a and 135b is indicated by dotted lines. A fifth mask pattern 145 is formed to expose the first PMOS transistor P1, which is another transistor that causes leakage current.

At this time, the isolation film 105 and a predetermined portion of the second PMOS active region 120b are located beside the first PMOS active region 120a, since the first PMOS active region 120a and the second PMOS active region 120b have a zigzag arrangement. Accordingly, exposure of the adjacent isolation film 105 and a portion of the second PMOS active region 120b in addition to the exposure of the first PMOS active region 120a is not a problem when exposing the first PMOS active region 120a. More specifically, the ion implantation into the second PMOS active region 120b for controlling the threshold voltage for the high voltage transistor does not cause problems, since the portion of the second PMOS active region 120b exposed by the fifth mask pattern 145 is not a device region.

In addition, though not depicted in the drawing, the first PMOS active regions 120a adjacent in the y-direction may be simultaneously exposed by the fifth mask pattern 145.

Afterward, threshold voltage control ions for a second high voltage transistor are implanted into the exposed region 140 of the first PMOS active region 120a exposed by the fifth mask pattern 145. The first PMOS transistor P1 may be given a greater threshold voltage than the second PMOS transistor P2, by the implantation of the threshold voltage control ions for the second high voltage transistor.

At this time, the ions implanted for controlling the threshold voltage for the first and second high voltage transistors may include boron, such as $BF_3^+$.

Figure 8:
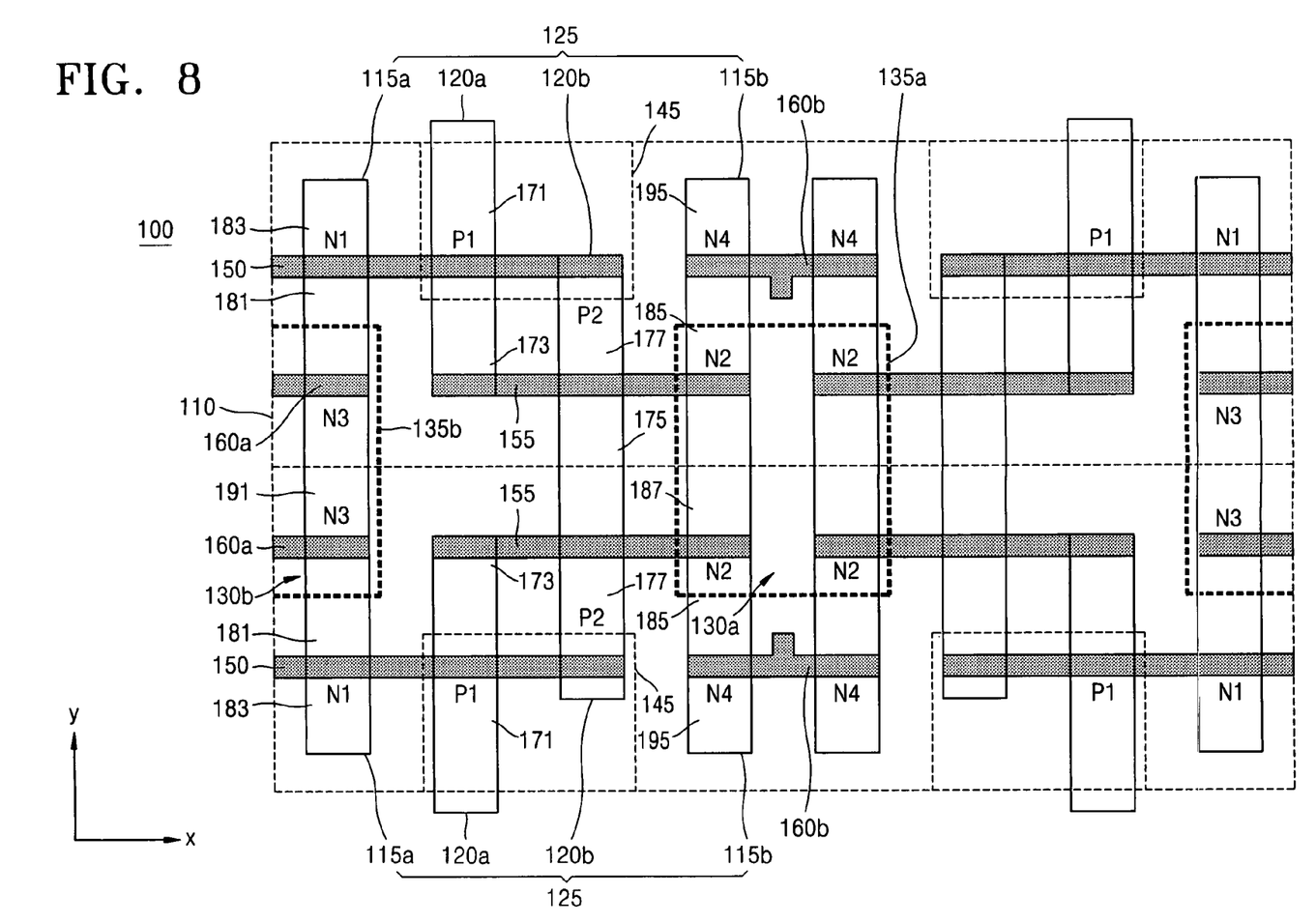

Referring to FIG. 8, first and second gate electrodes 150 and 155 and first and second word lines 160a and 160b are located on the unit cell regions 110.

The first gate electrode 150 extends in the x-direction to overlap the first NMOS active region 115a and the first PMOS active region 120a. The first gate electrode 150 may extend to overlap an end of the second PMOS active region 120b, but even this overlap occurs, a MOS transistor is not generated at the overlap.

The second gate electrode 155 extends in the x-direction to contact the second NMOS active region 115b and the second PMOS active region 120b. The second gate electrode 155 may extend to overlap with an end of the first PMOS active region 120a, but even if this overlap occurs, a MOS transistor is not generated at the overlap. Here, the first gate electrode 150 and the second gate electrode 155 are extended parallel and spaced apart from each other.

The first word line 160a extends to contact a predetermined portion of the first NMOS active region 115a, and the second word line 160b extends to contact a predetermined portion of the second NMOS active region 115b. The first word line 160a is commonly located on two first NMOS active regions 115a of adjacent unit cell regions 110, and the second word line 160b is commonly located on two second NMOS active region 115b of adjacent unit cell regions 110. Also, the first word line 160a extends parallel to the first gate electrode 150, and the second word line 160b extends parallel to the second gate electrode 155.

Subsequently, dopants are implanted into the active regions of both sides of the first and second gate electrodes 150 and 155 and the first and second word lines 160a and 160b. More specifically, source/drain regions 171, 173, 175, 177, 181, 183, 185, 187, 191, and 195 of the first and second PMOS transistors P1 and P2, the first and second NMOS transistors N1 and N2, and the first and second pass transistors N3 and N4 are defined, by selectively implanting an N-type dopant into the first and second NMOS active regions 115a and 115b and by selectively implanting a P-type dopant into the first and second PMOS active regions 120a and 120b, using photolithography.

In particular, in the figures, reference numeral 171 indicates a drain region of the first PMOS transistor P1, reference numeral 173 indicates a source region of the first PMOS transistor P1, reference numeral 175 indicates a drain region of the second PMOS transistor P2, and reference numeral 177 indicates a source region of the second PMOS transistor P2. Reference Numeral 181 indicates a source region of the first pass transistor N3 as well as a drain region of the first NMOS transistor N1, reference numeral 183 indicates a source region of the first NMOS transistor N1, reference numeral 185 indicates a drain region of the second NMOS transistor N2 as well as a source region of the second pass transistor N4, and reference numeral 187 indicates a source region of the second NMOS transistor N2. Reference numeral 191 indicates a drain region of the first pass transistor N3, and reference numeral 195 indicates a drain region of the second pass transistor N4.

Figure 9:
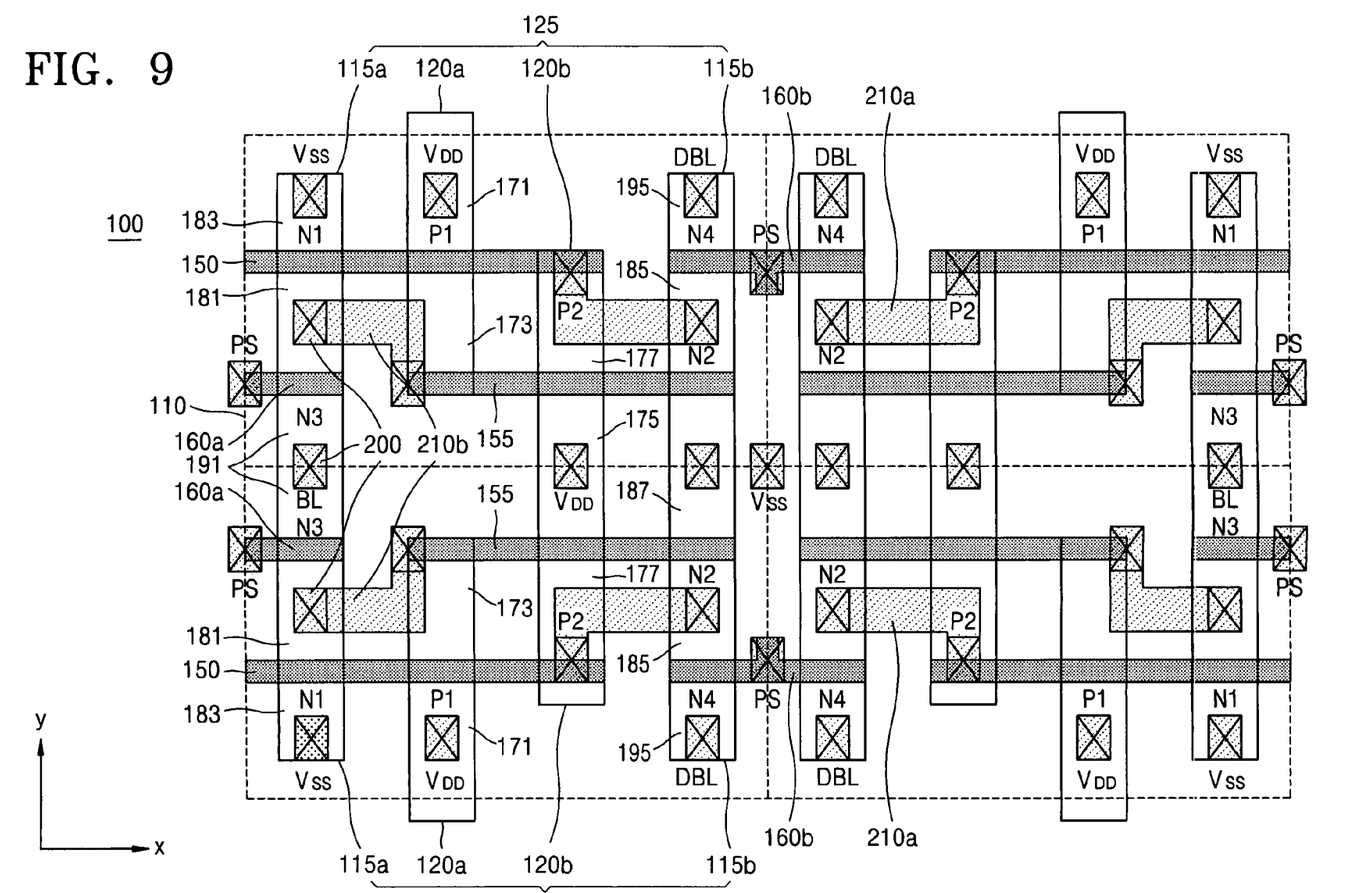

Referring to FIG. 9, contacts 200 and first and second metal wirings 210a and 210b are formed on the semiconductor substrate 100 on which the MOS transistors P1, P2, N1, N2, N3, and N4 are formed. The contacts 200 are formed on portions of the first and second gate electrodes 150 and 155, on portions of the first and second word lines 160a and 160b, on the drain region 171 of the first PMOS transistor P1, on the drain region 175 of the second PMOS transistor P2, on the source and drain regions 181 and 183 of the first NMOS transistor N1, on the source and drain regions 185 and 187 of the second NMOS transistor N2, and on the drain regions 191 and 195 of the first and second pass transistors N3 and N4. The first metal wiring 210a is formed to connect the contact 200 of the first gate electrode 150 to the drain 185 of the second NMOS transistor N2. The second metal wiring 210b is formed to connect the contact 200 of the second gate electrode 155 to the drain 181 of the first NMOS transistor N1.

In an embodiment of the present invention, a first inverter may include the first PMOS high voltage transistor P1 and the first NMOS transistor N1, a second inverter may include the second PMOS transistor P2 and the second NMOS high voltage transistor N2. In this embodiment, the first pass high voltage transistor N3 is connected to the second inverter and the second pass transistor N4 is connected to the first inverter.

A first metal wiring electrically connects an input of the first inverter and an output of the second inverter. A second metal wiring electrically connects an output of the first inverter and an input of the second inverter.

An inter layer insulating layer (not shown) separates the semiconductor substrate 100 from the first and second metal wirings 210a and 210b. The contacts 200 are formed in the interlayer insulating layer.

Also, though not shown in the drawing, a $V_{DD}$ contact and wiring, a $V_{SS}$ contact and wiring, a bit line BL contact and wiring, and a bit line bar DBL contact and wiring are formed to contact the contact 200 of the drains 171 and 175 of the first and second PMOS transistors P1 and P2, the contact 200 of the first and second NMOS transistors N1 and N2, the contact 200 of the first pass transistor N3, and the contact 200 of the second pass transistor N4, respectively.

Figure 10:
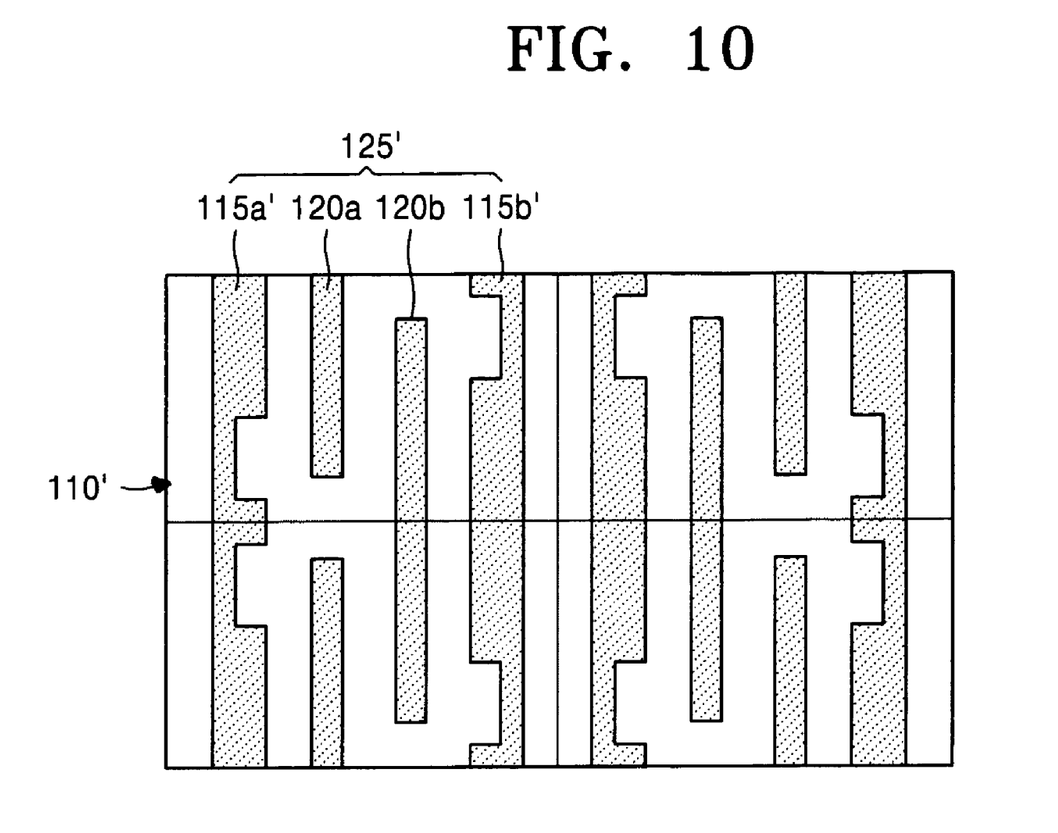
FIG. 10 illustrates a layout of an asymmetrical SRAM device according to another embodiment of the present invention.

The present invention is not limited to the above embodiments. FIG. 10 illustrates a layout of an asymmetrical SRAM device according to another embodiment of the present invention. For example, the active region 125 of the present embodiment may be formed in a bar shape of a uniform line-width. Further, a line-width of the active region 125', e.g., line-widths of a first and a second NMOS active region 115a' and 115b', may vary, as illustrated in a unit cell region 110' shown in FIG. 10, considering an area of the contact and the three-dimensional effect in a photolithography process. That is, in general, the active region 125 may have a bar shape, but the details of the shape may be modified by a designer.

As described above, according to an embodiment of the present invention, a plurality of unit cell regions are designed in a mirror image with respect to a boundary line between adjacent unit cell regions. Therefore, high voltage transistors are located close to high voltage transistors of adjacent unit cell regions, allowing for the simultaneous implantation of ions into adjacent high voltage transistor regions of neighboring unit cell regions.

When patterning a mask for implanting threshold voltage control ions for the high voltage transistor, the photolithography margin may be improved, since the ions are implanted into a wide area.

The design of an asymmetrical SRAM device is made possible by the above layout of the SRAM device.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An asymmetrical SRAM device, comprising:
a semiconductor substrate on which a plurality of unit cell regions are defined;
a plurality of active regions formed in each of the unit cell regions of the semiconductor substrate;
a first pass transistor region extending into each of four adjacent unit cell regions in a first set of unit cell regions; and
a second NMOS transistor region extending each of four adjacent unit cell regions in a second set of unit cell regions, wherein:
the active regions of each unit cell region are a mirror image of active regions of an adjacent one of the plurality of unit cell regions with respect to a boundary line between the adjacent unit cell regions,
the active regions of each unit cell region include:
a first NMOS active region in which a first NMOS transistor and a first pass transistor are disposed,
a second NMOS active region in which a second NMOS transistor and a second pass transistor are disposed,
a first PMOS active region in which a first PMOS transistor is disposed, and
a second PMOS active region in which a second PMOS transistor is disposed,
the second NMOS transistor has more threshold voltage control ions for high threshold voltage than the first NMOS transistor,
the first pass transistor has more threshold voltage control ions for high threshold voltage than the second pass transistor,
the first PMOS transistor has more threshold voltage control ions for high threshold voltage than the second PMOS transistor,
the first pass transistor region includes a first common region that is common to each of the four adjacent unit cell regions in the first set, the first common region having a first level of voltage control ions,
the second NMOS transistor region includes a second common region that is common to each of the four adjacent unit cell regions in the second set, the second common region having a second level of voltage control ions,
a first pass transistor from each of the four adjacent unit cell regions of the first set is disposed in the first pass transistor region, and
a second NMOS transistor from each of the four adjacent cell regions of the second set is disposed in the second NMOS transistor region.

2. The asymmetrical SRAM device as claimed in claim 1, further comprising, for each unit cell region:
a first gate electrode extended to traverse over the first NMOS active region and the first PMOS active region;
a second gate electrode extended to traverse over the second NMOS active region and the second PMOS active region;
a first word line parallel to the first gate electrode and traversing over the first pass transistor; and
a second word line parallel to the second gate electrode and traversing over the second pass transistor.

3. The asymmetrical SRAM device as claimed in claim 2, further comprising source/drain regions of the MOS transistors respectively formed on the active region on both sides of the first and second gate electrodes and the first and second word lines.

4. The asymmetrical SRAM device as claimed in claim 3, further comprising:
a first metal wiring that electrically connects the first gate electrode and the drain of the second NMOS transistor; and
a second metal wiring that electrically connects the second gate electrode and the drain of the first NMOS transistor.

5. An asymmetrical SRAM device, comprising:
a semiconductor substrate on which a plurality of unit cell regions are defined in a matrix;
a plurality of active regions located in each of the unit cell regions and including a first NMOS active region having a first NMOS transistor and a first pass transistor, a second NMOS active region having a second NMOS transistor and a second pass transistor, a first PMOS active region, and a second PMOS active region;
a gate structure including:
a first gate electrode traversing over the first NMOS active region and the first PMOS active region, a second gate electrode traversing over the second NMOS active region and the second PMOS active region, a first word line traversing over the first pass transistor, and a second word line traversing over the second pass transistor;

a plurality of source and drain regions respectively formed on the active region on both sides of the gate structure to define the first NMOS transistor within the first NMOS active region, the second NMOS transistor within the second NMOS active region, a first PMOS transistor within the first PMOS active region, a second PMOS transistor within the second PMOS active region, the first pass transistor within the first NMOS active region, and the second pass transistor within the second NMOS active region wherein:

the second NMOS transistor has more threshold voltage control ions for high threshold voltage than the first NMOS transistor, the first pass transistor has more threshold voltage control ions for high threshold voltage than the second pass transistor, the first PMOS transistor has more threshold voltage control ions for high threshold voltage than the second PMOS transistor, each unit cell region is a mirror image of an adjacent one of the unit cell regions with respect to a boundary line between the adjacent unit cell regions such that the second NMOS transistor is located adjacent to the boundary line of the unit cell region to face three other second NMOS transistors having more voltage control ions for high threshold voltage in adjacent unit cell regions, the first pass transistor is located adjacent to the boundary line of the unit cell to face three other first pass transistors having more voltage control ions for high threshold voltage in the adjacent unit cell regions, and the first PMOS transistor is located adjacent to the boundary line of the unit cell region to face another first PMOS transistor having more voltage control ions for high threshold voltage in the adjacent unit cell region, a first pass transistor region surrounds the first pass transistor in the unit cell region as well as the three other first pass transistors in the adjacent unit cell regions, the first pass transistor region including a first common region having a first level of voltage control ions, and a second NMOS transistor region surrounds the second NMOS transistor in the unit cell region as well as the three other second NMOS transistors in the adjacent unit cell regions, the second NMOS transistor region including a second common region having a second level of voltage control ions.

6. The asymmetrical SRAM device as claimed in claim 5, wherein an end of the second PMOS active region is shifted from a corresponding end of the first PMOS active region by a predetermined distance, thereby overlapping a predetermined portion of the second PMOS active region and an isolation film.

7. The asymmetrical SRAM device as claimed in claim 5, wherein the first and second gate electrodes extend parallel to each other, and the first word line extends parallel to the first gate electrode a predetermined distance apart therefrom, and the second word line extends parallel to the second gate electrode a predetermined distance apart therefrom.

8. The asymmetrical SRAM device as claimed in claim 7, wherein the first gate electrode further extends to overlap a predetermined portion of the second PMOS active region, and the first gate electrode overlaps an end of the second PMOS active region.

9. The asymmetrical SRAM device as claimed in claim 7, wherein the second gate electrode further extends to overlap a predetermined portion of the first PMOS active region, and the second gate electrode overlaps an end of the second PMOS active region.

10. The asymmetrical SRAM device as claimed in claim 5, further comprising:

a first metal wiring that electrically connects the first gate electrode and the drain of the second NMOS transistor; and a second metal wiring that electrically connects the second gate electrode and the drain of the first NMOS transistor.

11. An asymmetrical SRAM device, comprising:

a plurality of unit cell regions; and a unit SRAM cell formed in each unit cell region, the unit SRAM cell including:

a first inverter having a first PMOS transistor and a first NMOS transistor, a second inverter having a second PMOS transistor and a second NMOS transistor, wherein a threshold voltage of the first PMOS transistor is higher than a threshold voltage of the second PMOS transistor, and a threshold voltage of the second NMOS transistor is higher than a threshold voltage of the first NMOS transistor, a first pass transistor connected to an input of the second inverter, and a second pass transistor connected to an input of the first inverter, wherein a threshold voltage of the first pass transistor is higher than a threshold voltage of the second pass transistor, wherein:

the unit SRAM cell is a mirror image of an adjacent unit SRAM cell with respect to a boundary line between adjacent unit SRAM cells, the first PMOS transistor, the second NMOS transistor, and the first pass transistor are located adjacent to the boundary line of the unit SRAM cell to face another PMOS transistor in an adjacent unit SRAM cell having a threshold voltage higher than a threshold voltage of a second PMOS transistor in the adjacent unit SRAM cell, another second NMOS transistor in an adjacent unit SRAM cell having a threshold voltage higher than a threshold voltage of a first NMOS transistor in the adjacent unit SRAM cell and another first pass transistor in an adjacent unit SRAM cell having a threshold voltage higher than a threshold voltage of a second pass transistor in the adjacent unit SRAM cell, the first pass transistor, the other first pass transistor, and two additional first pass transistors are disposed in a first pass transistor region, the first pass transistor region including a first common region having a first level of voltage control ions, and the second NMOS transistor, the other second NMOS transistor, and two additional second NMOS transistors are disposed in a second NMOS transistor region, the second NMOS transistor region including a second common region having a second level of voltage control ions.

12. The asymmetrical SRAM device as claimed in claim 11, wherein the unit SRAM cell comprises a plurality of active regions, on which the transistors are formed, wherein the plurality of active regions comprises:

a first NMOS active region partially overlapping the first pass transistor region, on which the first NMOS transistor and the first pass transistor are formed;

a second NMOS active region partially overlapping the second NMOS transistor region, on which the second NMOS transistor and the second pass transistor are formed;

a first PMOS active region, on which the first PMOS transistor is formed; and a second PMOS active region, on which the second PMOS transistor is formed wherein:

each of the first and second NMOS active regions and the first and second PMOS active regions are formed in a bar shape extending in a same direction, the first and second NMOS active regions are parallel to each other spaced apart by a predetermined distance, and the first and second PMOS active regions are located between the first and second NMOS active regions.

13. The asymmetrical SRAM device as claimed in claim 12, further comprising:

a first gate electrode extended to traverse over a predetermined portion of the first NMOS active region and a predetermined portion of the first PMOS active region;

a second gate electrode extended to traverse over a predetermined portion of the second NMOS active region and a predetermined portion of the second PMOS active region;

a first word line parallel to the first gate electrode and traversing over a predetermined portion of the first NMOS active region; and a second word line parallel to the second gate electrode and traversing over a predetermined portion of the second NMOS active region.

14. The asymmetrical SRAM device as claimed in claim 1, wherein:

the first pass transistor region overlaps portions of two first NMOS active regions, the two first NMOS active regions belonging to adjacent unit cell regions, and the second NMOS transistor region overlaps portions of two second NMOS active regions, the two second active regions belonging to adjacent unit cell regions.

15. The asymmetrical SRAM device as claimed in claim 14, wherein the first level of voltage control ions is substantially equal to the second level of voltage control ions.

16. The asymmetrical SRAM device as claimed in claim 14, wherein:

the first NMOS active regions have a third level of voltage control ions, and the first pass transistor has a level of voltage control ions that is substantially equal to the first level plus the third level.

17. The asymmetrical SRAM device as claimed in claim 16, wherein:

the second NMOS active regions have a fourth level of voltage control ions, and the second NMOS transistor has a level of voltage control ions that is substantially equal to the second level plus the fourth level.

18. The asymmetrical SRAM device as claimed in claim 5, wherein:

the first pass transistor region overlaps portions of two first NMOS active regions, the two first NMOS active regions belonging to adjacent unit cell regions, and the second NMOS transistor region overlaps portions of two second NMOS active regions, the two second active regions belonging to adjacent unit cell regions.

19. The asymmetrical SRAM device as claimed in claim 18, wherein the first level of voltage control ions is substantially equal to the second level of voltage control ions.

20. The asymmetrical SRAM device as claimed in claim 18, wherein:

the first NMOS active regions have a third level of voltage control ions, and the first pass transistor has a level of voltage control ions that is substantially equal to the first level plus the third level.

21. The asymmetrical SRAM device as claimed in claim 20, wherein:

the second NMOS active regions have a fourth level of voltage control ions, and the second NMOS transistor has a level of voltage control ions that is substantially equal to the second level plus the fourth level.

* * * * *